US009304409B2

(12) United States Patent
Novak et al.

(10) Patent No.: US 9,304,409 B2
(45) Date of Patent: *Apr. 5, 2016

(54) LIQUID JET AND RECOVERY SYSTEM FOR IMMERSION LITHOGRAPHY

(71) Applicant: NIKON CORPORATION, Tokyo (JP)

(72) Inventors: W. Thomas Novak, Redwood City, CA (US); Andrew J. Hazelton, Tokyo (JP); Douglas C. Watson, Campbell, CA (US)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/283,827

(22) Filed: May 21, 2014

(65) Prior Publication Data

US 2014/0253888 A1    Sep. 11, 2014

Related U.S. Application Data

(60) Division of application No. 13/200,982, filed on Oct. 6, 2011, now abandoned, which is a division of application No. 12/232,513, filed on Sep. 18, 2008, now Pat. No. 8,059,258, which is a division of (Continued)

(51) Int. Cl.
  *G03B 27/52*  (2006.01)
  *G03F 7/20*  (2006.01)

(52) U.S. Cl.
  CPC ................... *G03F 7/70341* (2013.01)

(58) Field of Classification Search
  CPC .............................. G03F 7/70341; G03F 7/2041
  See application file for complete search history.

(56) References Cited

U.S. PATENT DOCUMENTS

| 4,346,164 | A |   | 8/1982  | Tabarelli et al. |
| 4,480,910 | A |   | 11/1984 | Takanashi et al. |
| 5,610,683 | A |   | 3/1997  | Takahashi |
| 5,715,039 | A |   | 2/1998  | Fukuda et al. |
| 5,825,043 | A |   | 10/1998 | Suwa |
| 6,517,635 | B2 | * | 2/2003  | Mitsumori et al. ............... 134/1 |

(Continued)

FOREIGN PATENT DOCUMENTS

| DE | 221 563 A1 | 4/1985 |
| DE | 224 448 A1 | 7/1985 |

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Mesfin T Asfaw
(74) *Attorney, Agent, or Firm* — Oliff PLC

(57) ABSTRACT

A liquid immersion lithography apparatus includes a projection system, an opening from which liquid is supplied to a space under the projection system, the opening being connectable to a liquid source via a flow passage to supply the liquid to the space and the opening being connectable to a vacuum source via the flow passage, and a holding member by which a substrate is held, the holding member being movable below the projection system and the opening. The substrate held by the holding member is exposed through the liquid that is supplied from the opening and that covers only a portion of an upper surface of the substrate.

22 Claims, 7 Drawing Sheets

Related U.S. Application Data application No. 11/236,759, filed on Sep. 28, 2005, now Pat. No. 7,443,482, which is a continuation of application No. PCT/US2004/010071, filed on Apr. 1, 2004.

(60) Provisional application No. 60/462,786, filed on Apr. 11, 2003.

(56) References Cited

U.S. PATENT DOCUMENTS

| | | | |
|---|---|---|---|
| 6,878,916 B2 | 4/2005 | Schuster |
| 6,891,596 B2 | 5/2005 | Rostalski et al. |
| 6,970,232 B2 | 11/2005 | McGuire, Jr. |
| 7,091,502 B2 | 8/2006 | Gau et al. |
| 7,443,482 B2 | 10/2008 | Novak et al. |
| 7,697,111 B2 | 4/2010 | Shirai et al. |
| 7,911,582 B2 | 3/2011 | Hirukawa et al. |
| 7,932,989 B2 | 4/2011 | Novak et al. |
| 8,059,258 B2 | 11/2011 | Novak et al. |
| 2002/0020821 A1 | 2/2002 | Van Santen et al. |
| 2002/0163629 A1 | 11/2002 | Switkes et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068499 A1 | 3/2005 | Dodoc et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0225738 A1 | 10/2005 | Shirai |
| 2005/0270505 A1 | 12/2005 | Smith |
| 2006/0203218 A1 | 9/2006 | Shirai et al. |
| 2006/0209285 A1 | 9/2006 | Shirai |
| 2007/0030468 A1 | 2/2007 | Shirai |
| 2007/0201011 A1 | 8/2007 | Kokubun et al. |
| 2008/0151203 A1 | 6/2008 | Hirukawa et al. |
| 2009/0103070 A1 | 4/2009 | Shirai et al. |

FOREIGN PATENT DOCUMENTS

| | | |
|---|---|---|
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-7-220990 | 8/1995 |
| JP | A-8-316125 | 11/1996 |
| JP | A-10-303114 | 11/1998 |
| JP | A-10-340846 | 12/1998 |
| JP | A-11-176727 | 7/1999 |
| JP | A-2000-58436 | 2/2000 |
| WO | WO99/49504 A1 | 9/1999 |
| WO | WO 02/091078 A1 | 11/2002 |
| WO | WO 03/077036 A1 | 9/2003 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A1 | 1/2005 |
| WO | WO 2005/008339 A1 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |

(56) References Cited

FOREIGN PATENT DOCUMENTS

| | | |
|---|---|---|
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, $3^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Dec. 21, 2006 Office Action for U.S. Appl. No. 11/236,759.
Dec. 28, 2007 Office Action for U.S. Appl. No. 11/236,759.
Oct. 27, 2009 Office Action for U.S. Appl. No. 12/232,513.
Oct. 23, 2009 Office Action in U.S. Appl. No. 11/808,850.
May 11, 2010 Notice of Allowance in U.S. Appl. No. 11/808,850.
Sep. 3, 2010 Notice of Allowance in U.S. Appl. No. 11/808,850.
Jun. 27, 2007 Notice of Allowance in U.S. Appl. No. 11/236,759.
Jun. 19, 2008 Notice of Allowance in U.S. Appl. No. 11/236,759.
Jun. 4, 2010 Notice of Allowance in U.S. Appl. No. 12/232,513.
Jan. 12, 2010 Japanese Office Action in Japanese Application No. 2006-509591, with translation.
Apr. 20, 2005 International Search Report in International Application No. PCT/US04/10071.
May 6, 2010 Japanese Office Action in Japanese Application No. 2006-509591, with translation.
Aug. 3, 2010 Notice of Allowance in Japanese Application No. 2006-509591, with translation.
Oct. 4, 2010 Office Action in U.S. Appl. No. 12/232,513.
Dec. 22, 2010 Notice of Allowance in U.S. Appl. No. 11/808,850.
Jul. 6, 2011 Notice of Allowance issued in U.S. Appl. No. 12/232,513.
Feb. 21, 2013 Office Action issued in U.S. Appl. No. 12/923,948.
Nov. 21, 2013 Office Action issued in U.S. Appl. No. 13/200,982.

\* cited by examiner

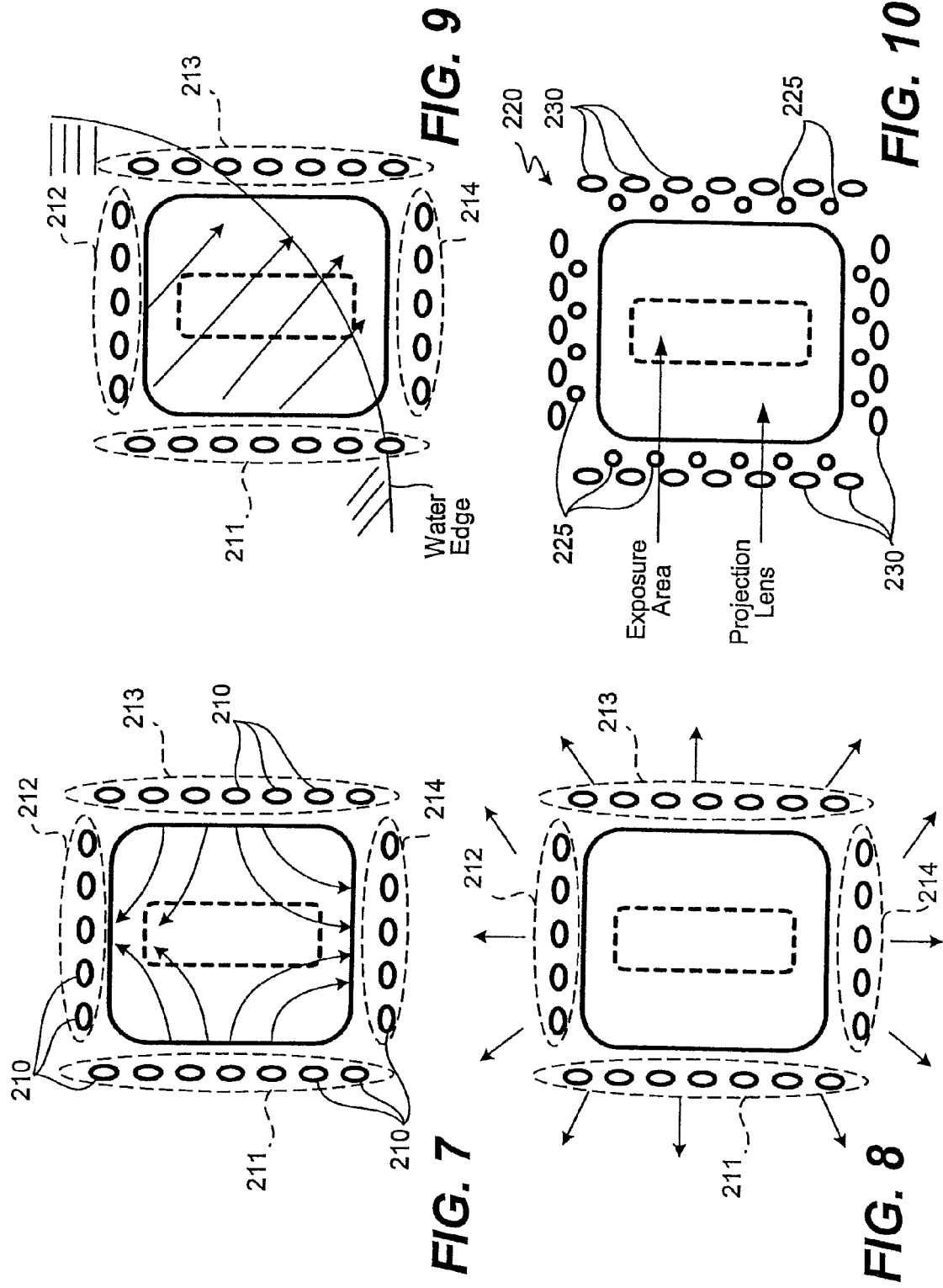

LIQUID JET AND RECOVERY SYSTEM FOR IMMERSION LITHOGRAPHY

CROSS-REFERENCE TO RELATED APPLICATIONS

This is a Divisional of U.S. patent application Ser. No. 13/200,982 filed Oct. 6, 2011 (now abandoned), which in turn is a Divisional of U.S. patent application Ser. No. 12/232,513 filed Sep. 18, 2008 (now U.S. Pat. No. 8,059,258), which is a Divisional of U.S. patent application Ser. No. 11/236,759 filed Sep. 28, 2005 (now U.S. Pat. No. 7,443,482), which is a Continuation of International Application No. PCT/US2004/010071 filed Apr. 1, 2004, which claims the benefit of U.S. Provisional Patent Application No. 60/462,786 filed Apr. 11, 2003. The entire disclosures of each of the prior applications are hereby incorporated by reference in their entireties.

BACKGROUND

This invention relates to a liquid jet and recovery system for an immersion lithography apparatus, adapted to supply a liquid into the space between a workpiece such as a wafer and the last-stage optical element such as a lens of an optical system for projecting the image of a reticle onto the workpiece.

Such an immersion lithography system has been disclosed, for example, in WO99/49504, which is herein incorporated by reference for describing the general background of the technology and some general considerations. One of the issues with existing immersion lithography mechanisms is the supplying and recovery of the immersion liquid. An improved system for supplying and recovering a liquid for immersion lithography is needed.

SUMMARY

Various liquid jet and recovery systems embodying this invention for an immersion lithography apparatus will be described below for having an image pattern projected onto a workpiece such as a wafer. The image pattern is typically provided by a reticle placed on a reticle stage and projected by an optical system including an illuminator and a last-stage optical element that is disposed opposite the workpiece with a gap in between that element and the workpiece. The last-stage optical element may or may not be a lens and is hereinafter sometimes simply referred to as "the optical element." The aforementioned gap is hereinafter referred to as "the exposure region" because the image pattern is projected onto the workpiece through this gap.

The purpose of a liquid jet and recovery system is to supply a fluid such as water into this exposure region, to entrain it there at least during the projection of the image pattern on the workpiece and to remove (or to recover) it away from the exposure region. In order to carry out the supply and recovery of the fluid quickly and smoothly without generating air bubbles, arrays of nozzles are arranged to have their openings located proximal to the exposure region. According to one aspect of the invention, these nozzles are each adapted to serve selectively either as a source nozzle for supplying a fluid into the exposure region or as a recovery nozzle for recovering the fluid from the exposure region. A fluid controlling device is further provided, the functions of which include causing nozzles of selected one or more of these arrays on one or more of the sides of the exposure region to serve as source nozzles and causing a fluid to be supplied through them into the exposure region such that the supplied fluid contacts both the workpiece and the optical element for immersion lithography.

The fluid controlling device also may be adapted to simultaneously cause nozzles of selected one or more of the remaining arrays to serve as recovery nozzles. Since each of the nozzles can serve selectively either as a supply nozzle or a recovery nozzle, various flow patterns can be realized by this fluid controlling device. For example, the fluid may be supplied into the exposure region through the nozzles of the array on a specified side and removed through those on the array on the opposite side, the nozzles of the arrays on the remaining sides neither supplying nor recovering the fluid. As another example, the fluid may be supplied into the exposure region through the nozzles of mutually oppositely facing arrays and recovered through those of the arrays on the transversely facing arrays. As a third example, a flow in a diagonal direction may be realized if the fluid is supplied from the nozzles of two arrays on mutually adjacent and mutually perpendicular sides of the exposure region and recovered through those of the remaining arrays on the oppositely facing sides. Alternatively, the fluid may be supplied through all of the nozzles surrounding substantially all around the exposure region to have the fluid entrained inside the exposure region.

According to another aspect of the invention, arrays of nozzles exclusively adapted to supply a fluid, herein referred to as fluid-supply nozzles, and arrays of nozzles exclusively adapted to recover the fluid, herein referred to as fluid-recovery nozzles, are separately provided, the fluid-supply nozzles surrounding the exposure region and the fluid-recovery nozzles surrounding the fluid-supply nozzles from all sides. According to a preferred embodiment, a groove is formed substantially all around the exposure region and the fluid-recovery nozzles are arranged to open into this groove such that a uniform flow can be more easily established. In this case too, the fluid controlling device can establish the variety of flow patterns as explained above.

As explained above, the optical element that is disposed opposite the workpiece and that comes into direct contact with the fluid such as water need not be a lens. According to a preferred embodiment of the invention, this last-stage optical element comprises a pair of optical plates contacting each other across a contact plane and having channels formed on this contact plane, these channels connecting to the exposure region such that the fluid can be passed through these channels into or out of the exposure region. This embodiment is preferred because the fluid used for immersion lithography tends to affect the material of the optical element adversely, and lenses are more expensive and troublesome to replace than optical plates.

BRIEF DESCRIPTION OF THE DRAWINGS

The invention will be described in conjunction with the following drawings of exemplary embodiments in which like references numerals designate like elements, and in which:

FIGS. 6-9 are schematic plan views of the liquid jet and recovery system of FIGS. 4 and 5 to show various flow patterns that may be established;

FIG. 10 is a schematic plan view of another liquid jet and recovery system embodying this invention;

DETAILED DESCRIPTION OF EMBODIMENTS

Figure 1:
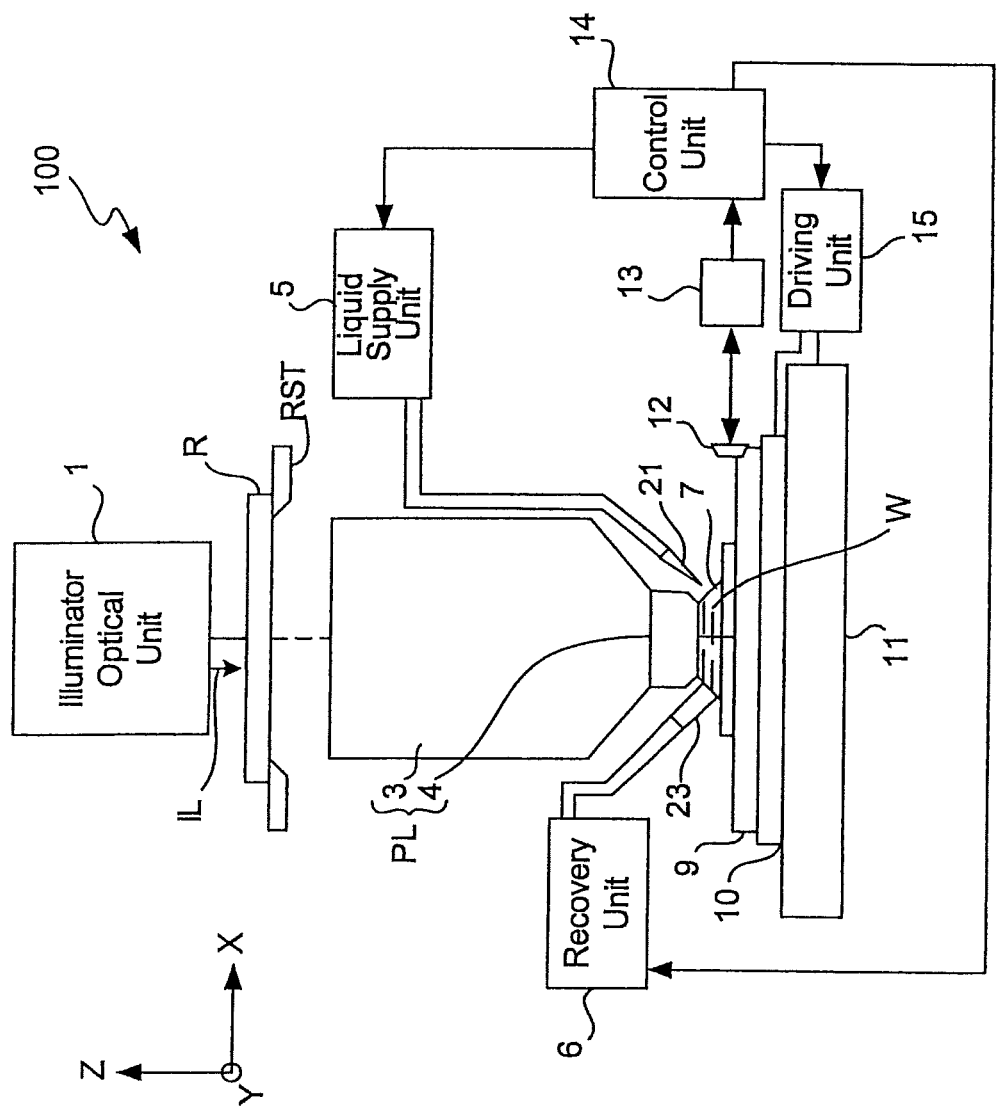
FIG. 1 is a schematic cross-sectional view of an immersion lithography apparatus that incorporates the invention.

FIG. 1 shows an immersion lithography apparatus 100 that may incorporate a liquid jet and recovery system embodying this invention, however, this exemplary example of an immersion lithography apparatus itself is not intended to limit the scope of the invention.

As shown in FIG. 1, the immersion lithography apparatus 100 comprises an illuminator optical unit 1 including a light source such as a KrF excimer laser unit, an optical integrator (or homogenizer) and a lens and serving to emit pulsed ultraviolet light IL with wavelength 248 nm to be made incident to a pattern on a reticle R. The pattern on the reticle R is projected onto a wafer W coated with a photoresist at a specified magnification (such as ¼ or ⅕) through a telecentric light projection unit PL. The pulsed light IL may alternatively be ArF excimer laser light with wavelength 193 nm, $F_2$ laser light with wavelength 157 nm or the i-line of a mercury lamp with wavelength 365 nm. In what follows, the coordinate system with X-, Y- and Z-axes as shown in FIG. 1 is referenced to explain the directions in describing the structure and functions of the lithography apparatus 100. For the convenience of disclosure and description, the light projection unit PL is illustrated in FIG. 1 only by way of its last-stage optical element (such as a lens) 4 disposed opposite to the wafer W and a cylindrical housing 3 containing all the others of its components.

The reticle R is supported on a reticle stage RST incorporating a mechanism for moving the reticle R in the X-direction, the Y-direction and the rotary direction around the Z-axis. The two-dimensional position and orientation of the reticle R on the reticle stage RST are detected by a laser interferometer (not shown) in real time and the positioning of the reticle R is effected by a main control unit 14 on the basis of the detection thus made.

The wafer W is held by a wafer holder (not shown) on a Z-stage 9 for controlling the focusing position (along the Z-axis) and the tilting angle of the wafer W. The Z-stage 9 is affixed to an XY-stage 10 adapted to move in the XY-plane substantially parallel to the image-forming surface of the light projection unit PL. The XY-stage 10 is set on a base 11. Thus, the Z-stage 9 serves to match the wafer surface with the image surface of the light projection unit PL by adjusting the focusing position (along the Z-axis) and the tilting angle of the wafer W by the auto-focusing and auto-leveling method, and the XY-stage 10 serves to adjust the position of the wafer W in the X-direction and the Y-direction.

The two-dimensional position and orientation of the Z-stage 9 (and hence also of the wafer W) are monitored in real time by another laser interferometer 13 with reference to a mobile mirror 12 affixed to the Z-stage 9. Control data based on the results of this monitoring are transmitted from the main control unit 14 to a stage-driving unit 15 adapted to control the motions of the Z-stage 9 and the XY-stage 10 according to the received control data. At the time of an exposure, the projection light is made to sequentially move from one to another of different exposure positions on the wafer W according to the pattern on the reticle R in a step-and-repeat routine or a step-and-scan routine.

The lithography apparatus 100 being described with reference to FIG. 1 is an immersion lithography apparatus and is hence adapted to have a liquid 7 of a specified kind such as water filling the space between the surface of the wafer W and the lower surface of the last-stage optical element 4 of the light projection unit PL at least while the pattern image of the reticle R is being copied onto the wafer W.

The last-stage optical element 4 of the light projection unit PL is detachably affixed to the cylindrical housing 3. The liquid 7 is supplied from a liquid supply unit 5 that may comprise a tank, a pressure pump and a temperature regulator (not individually shown) to the space above the wafer W under a temperature-regulated condition and is collected by a liquid recovery unit 6. The temperature of the liquid 7 is regulated to be approximately the same as the temperature inside the chamber in which the lithography apparatus 100 itself is disposed. Source nozzles 21 through which the liquid 7 is supplied from the supply unit 5 and recovery nozzles 23 through which the liquid 7 is collected into the recovery unit 6 are only schematically shown. Their arrangements will be described more in detail below because they are parts of a liquid jet and recovery system to which this invention relates.

Figure 4:
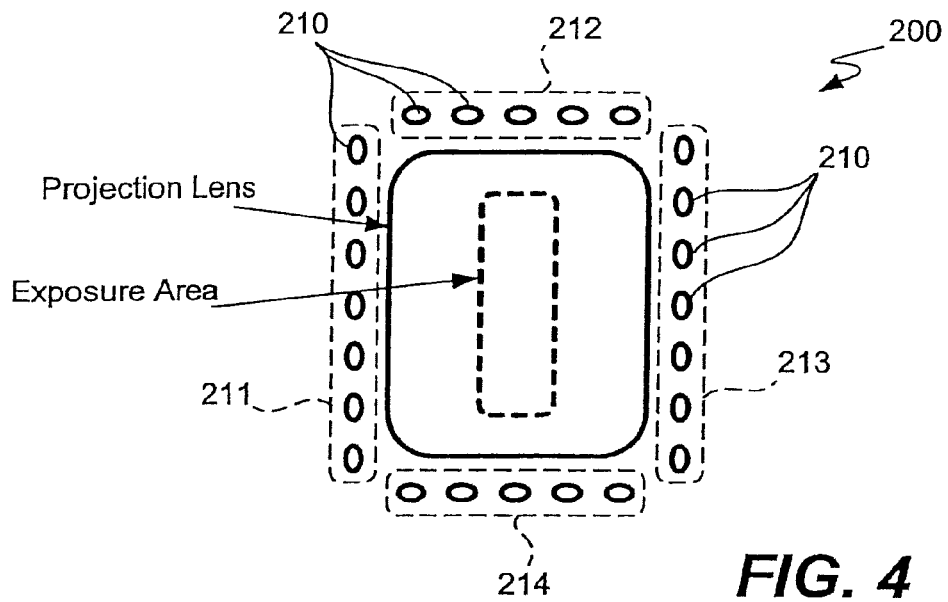
FIG. 4 is a schematic plan view of a liquid jet and recovery system embodying this invention that may be incorporated in the lithography apparatus of FIG. 1.

According to this invention, multiple jets are provided to inject an immersion fluid (referenced above as the liquid 7) between the wafer W to be exposed and the last-stage optical element 4 of the light projection unit PL for projecting an image pattern thereon. FIGS. 4 and 5 show schematically the design of a liquid jet and recovery system 200 embodying this invention which may be incorporated in the lithography apparatus 100 described above, FIG. 5 being its horizontal side view and FIG. 4 being its plan view. The design is characterized as having a large plural number of nozzles 210 arranged in a quasi-continuous manner in arrays on all sides of the exposure area by the light projection unit PL. According to the embodiment illustrated in FIG. 4, the nozzles 210 are arranged in four arrays 211, 212, 213 and 214, each of the arrays being on one side of a rectangular formation.

Although FIG. 1 showed the source nozzles 21 connected to the liquid supply unit 5 and the recovery nozzles 23 connected to the liquid recovery unit 6 separately, it was for the convenience of illustration. The nozzles 210 shown in FIGS. 4 and 5 instead are each adapted to function both as a source nozzle and as a recovery nozzle, or explained more precisely, to be controlled so as to function selectively either as a source nozzle or as a recovery nozzle under the control of the main control unit 14.

Figure 5:
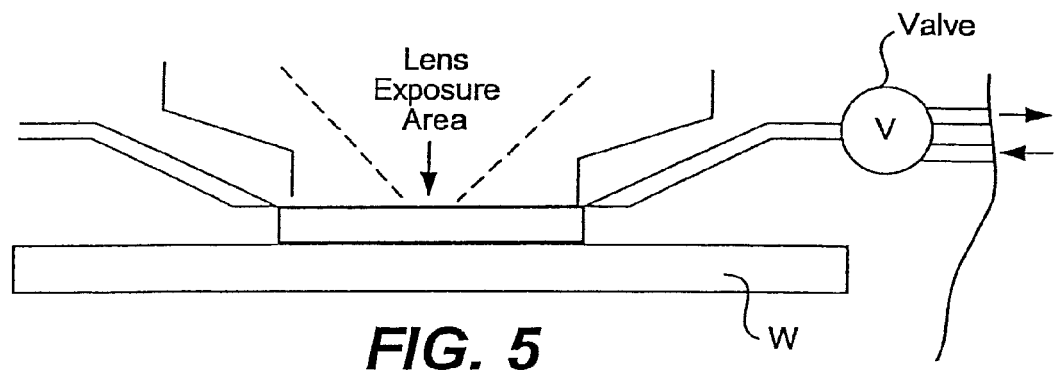
FIG. 5 is a schematic side view of the liquid jet and recovery system of FIG. 4.
Figure 6:
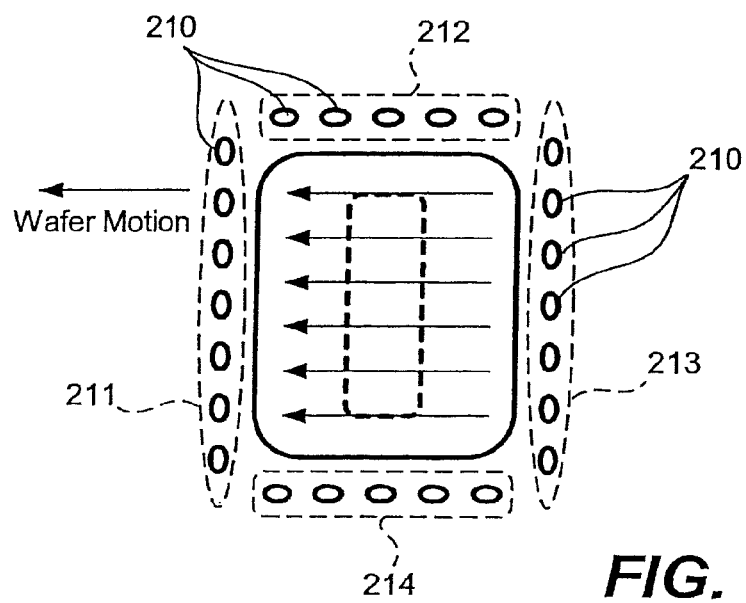

FIGS. 6-9 show different ways in which the liquid jet and recovery system 200 of FIGS. 4 and 5 may be operated. FIG. 6 shows an example in which the wafer scan direction is as shown by an arrow and the nozzles 210 in one of the arrays (i.e., array 213) are controlled so as to function as source nozzles while those in the opposite array 211 are controlled so as to function as recovery nozzles, those in the remaining two arrays 212 and 214 being controlled to function neither as source nozzles nor as recovery nozzles. As a result, the flow pattern of the liquid 7 will be as shown by parallel arrows.

FIG. 7 shows another example in which the nozzles 210 in mutually opposite arrays (i.e., arrays 211 and 213) are controlled so as to function as source nozzles while those in the remaining arrays 212 and 214 are controlled so as to function as recovery nozzles. The resultant flow pattern of the liquid 7 will be as shown by arcuate arrows. In other words, the wafer W may be moved in two scanning directions while the liquid 7 is directed in two orthogonal directions.

FIG. 8 shows still another example in which all nozzles 210 in all of the arrays are controlled so as to function as source nozzles, serving to entrain the liquid 7 in the region below the projection lens of the light projection unit PL between its last-stage optical element 4 and the wafer W, the flow pattern being shown by radially outwardly pointing arrows.

FIG. 9 shows still another example in which the nozzles 210 in two mutually adjacent arrays (i.e., arrays 211 and 212) are controlled so as to function as source nozzles and those in the remaining arrays 213 and 214 are controlled so as to function as recovery nozzles. The resultant flow pattern of the liquid 7 is shown by diagonal arrows.

In summary, in each of these examples, the nozzles 210 are individually controlled, or the jets are connected to valves that can be selectively set on and off as source or recovery. They may be arranged such that a single valve may control several jets together. The jets may be individual parts or integrated together as a single unit. The valve shown in FIG. 5, therefore, may be regarded as being connected to only one nozzle or to a group of nozzles. Alternatively, the nozzles may be controlled as groups. For example, group 211 may be controlled by a single valve or groups 211 and 213 may be controlled by a single valve.

FIG. 10 shows another liquid jet and recovery system 220 with an alternative arrangement characterized as providing source nozzles 225 and recovery nozzles 230 independently. In other words, unlike the system 200 shown in FIGS. 4-9 with nozzles each functioning selectively either as a source nozzle or as a recovery nozzle, the system 220 shown in FIG. 10 is provided with the source nozzles 225 which are not adapted to function as a recovery nozzle and the recovery nozzles 230 which are not adapted to function as a source nozzle.

According to the example shown in FIG. 10, the source nozzles 225 and the recovery nozzles 230 are separately arranged in arrays around the exposure area, the arrays of the source nozzles 225 being each arranged inside the corresponding one of the arrays of the recovery nozzles 230. Each nozzle may be configured with a valve to turn the nozzle on or off. Alternatively, a single valve may control several jets together. Any of the flow patterns described above with reference to FIGS. 6-9 can be established with the system 220 shown in FIG. 10.

Figure 11:
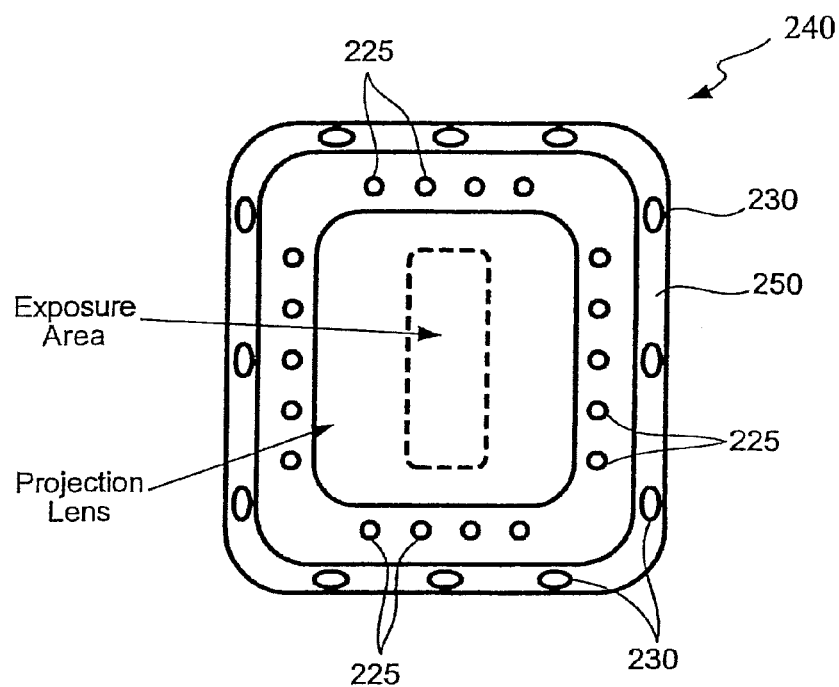
FIG. 11 is a schematic plan view of still another liquid jet and recovery system embodying this invention.
Figure 12:
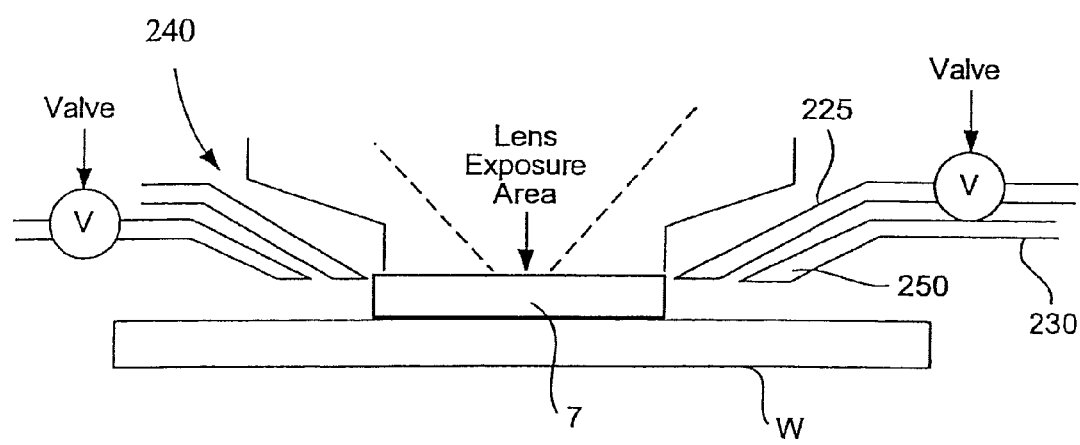
FIG. 12 is a schematic side view of the liquid jet and recovery system of FIG. 11.

FIGS. 11 and 12 show still another liquid jet and recovery system 240 that is similar to the system 220 described above with reference to FIG. 10 but is different in that a liquid recovery zone 250 is provided substantially all around the exposure area. The liquid recovery zone 250 may comprise a channel cut into a supporting port or a loop made of a suitable material. Individually controllable recovery nozzles 230 are located in the interior of the recovery zone 250. The zone 250 thus provided is advantageous in that the liquid 7 can be pumped out more uniformly. The source nozzles 225 may be independently controlled or used in groups, as in the embodiments explained above, to establish any of the flow patterns shown in FIGS. 6-9.

In the description given above, the last-stage optical element 4 may or may not be a lens. The lower surface of this optical element 4, adapted to come into direct contact with the liquid 7, tends to become soiled as particles removed from the photoresist and the impurities contained in the liquid 7 become attached to it. For this reason, the last-stage optical element 4 may be required to be exchanged from time to time, but if the element that must be replaced by a new element is a lens, the maintenance cost (or the so-called "running cost") becomes inconveniently high and it takes a longer time for the exchange.

Figure 13:
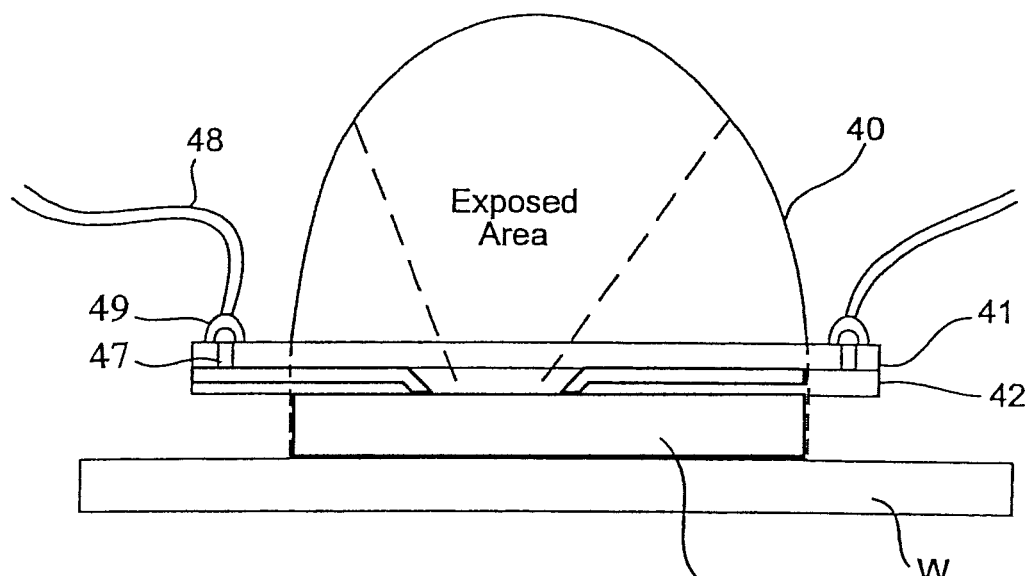
FIG. 13 is a schematic side view of still another liquid jet and recovery system embodying this invention.
Figure 14:
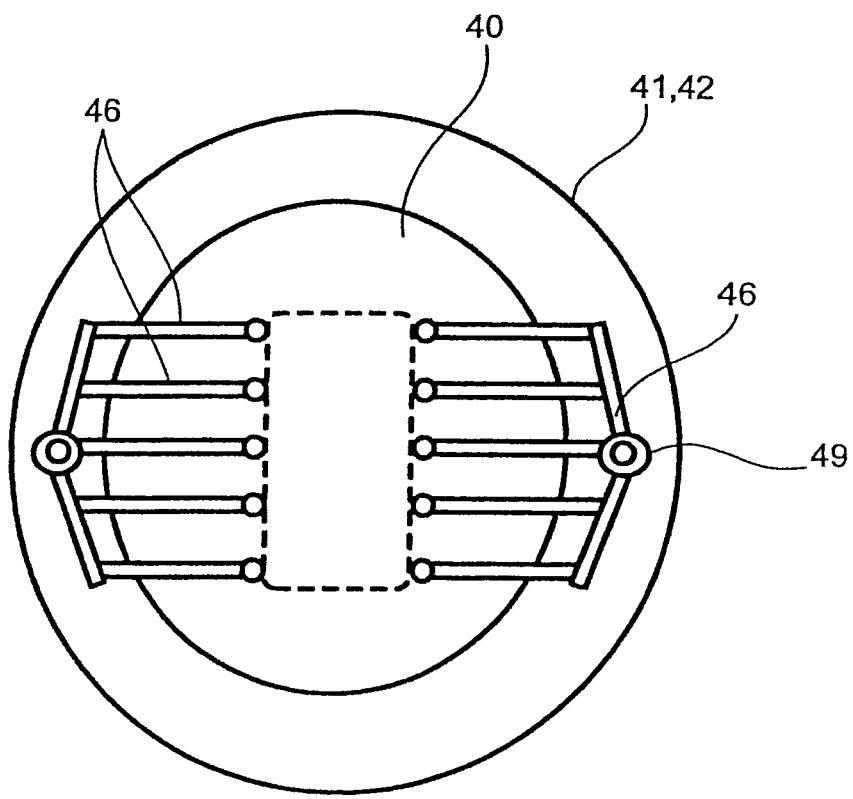
FIG. 14 is a schematic plan view of the liquid jet and recovery system of FIG. 13.

In view of this problem, the light projection unit PL of the immersion lithography apparatus 100 may be designed such that its last-stage optical element 4 is not a lens. FIGS. 13 and 14 show an example embodying this invention characterized as having a pair of mutually intimately contacting optical plates (upper plate 41 and lower plate 42) disposed below the lens 40 that would be the last-stage optical element 4 of the light projection unit PL but for these plates 41 and 42.

The embodiment of the invention shown in FIGS. 13 and 14 is further characterized as integrating the liquid injection nozzle arrays with the last-stage optical element of the light projection unit PL. As shown in FIGS. 13 and 14, the lower plate 42 may be provided with grooves on the upper surface so as to form liquid-passing channels 46 as the two plates 41 and 42 are attached to each other. The channels 46 each open at the lower surface, and the upper plate 41 is provided with throughholes 47 each attached to a hose 48 by way of an adaptor 49 such that the liquid 7 may be injected into and recovered from the space between the wafer W and the lower plate 42 through the channels 46, the throughholes 47 and the hoses 48.

The optical plates 41 and 42 may be of a known kind having parallel surfaces serving to correct the optical characteristics of the light projection unit PL such as its spherical aberration and coma. This embodiment is advantageous because the plates 41 and 42 are less expensive to replace than a lens. Substances such as organic silicon compounds may become attached to the surface of the optical plates 41 and 42 so as to adversely affect the optical characteristics of the light projection unit PL such as its light transmissivity and brightness as well as the uniformity of brightness on the wafer W but the user has only to replace the relatively inexpensive optical plates and the running cost would be significantly less than if the last-stage optical element 4 were a lens. The plates 41 and 42 and the lens 40 alternatively may be cemented together by using optical cements suitable for the wavelengths being used.

The liquid jet and recovery system according to this embodiment is advantageous for many reasons. First, the nozzles can be set close to the exposure area. This helps to insure a continuous layer of bubble-free liquid in the exposure region. It also helps when the edge of the wafer is being exposed because the edge of the wafer is a discontinuity and may perturb the liquid layer, causing bubbles to enter the region being exposed. Second, the layer of liquid around the nozzles is roughly continuous and uniform, allowing for capillary action to help make certain that the liquid layer is uniform. Third, the lens may be of a material such as calcium fluoride that degrades and dissolves in water while the plates may be a material such as fused silica that is stable in contact with water. Fourth, the region between the channels is open for auxiliary optical beams. These beams may be used for through-the-lens focusing, or for other purposes.

Systems according to this invention are generally capable of providing a uniform, bubble-free layer of water between the optical element and the wafer. It may also improve the speed for filling the gap and removing the liquid in the outward areas of the lens or the stage areas surrounding the wafer. Furthermore, it will prevent degradation of the lens or the surface of the optics that may be affected by the contact with the immersion fluid.

Figure 2:
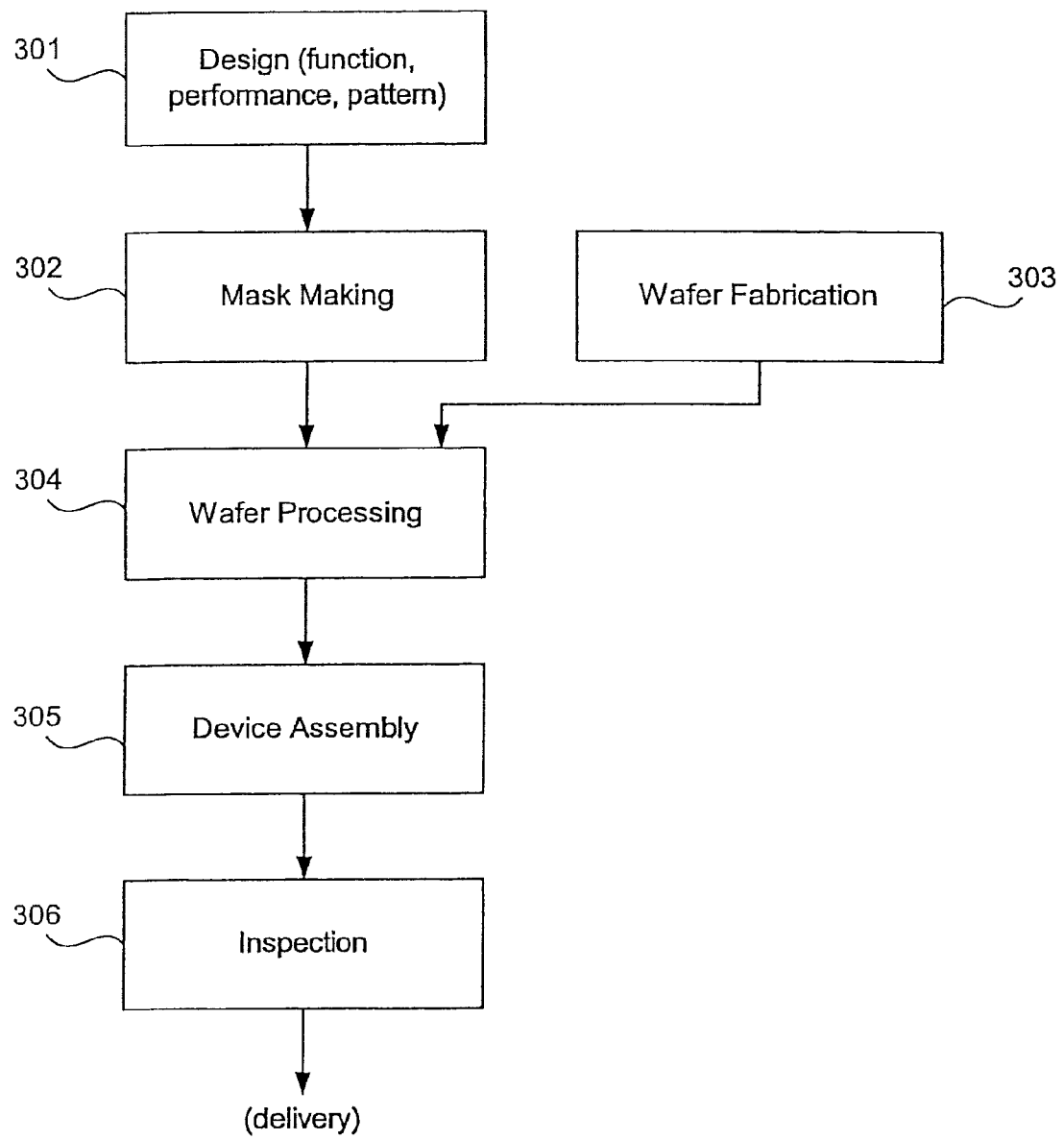
FIG. 2 is a process flow diagram illustrating an exemplary process by which semiconductor devices are fabricated using the apparatus shown in FIG. 1 according to the invention.

FIG. 2 is referenced next to describe a process for fabricating a semiconductor device by using an immersion lithography apparatus incorporating a liquid jet and recovery system embodying this invention. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
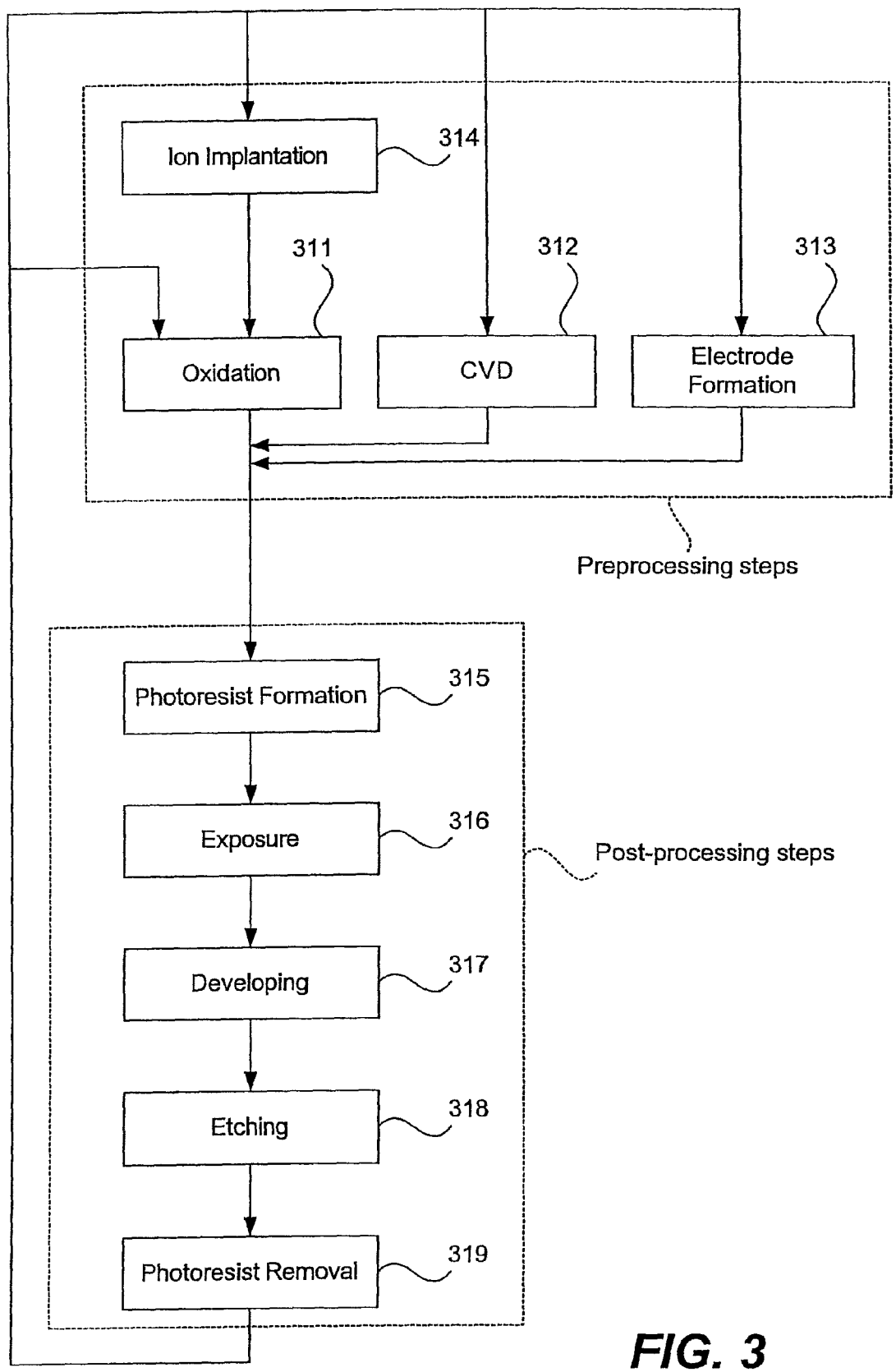
FIG. 3 is a flowchart of the wafer processing step shown in FIG. 2 in the case of fabricating semiconductor devices according to the invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The aforementioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316 (exposure step), the above-mentioned exposure device is used to transfer the circuit pattern of a mask (reticle) onto a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

While a lithography system of this invention has been described in terms of several preferred embodiments, there are alterations, permutations, and various equivalents which fall within the scope of this invention. It also should be noted that there are many alternative ways of implementing the methods and apparatus of the invention. It also goes without saying that the liquid need not be water but may be perfluoropolyether (PFPE) such as Fomblin oil used when the light source is $F_2$ laser (157 nm).

What is claimed is:

1. A liquid immersion lithography apparatus comprising:
    a projection system;
    a flow passage having a first end and a second end, the first end of the flow passage having an opening from which liquid is supplied to a space under the projection system, the opening being connectable to a liquid source via the second end of the flow passage to supply the liquid to the space and the opening being connectable to a vacuum source via the second end of the flow passage; and
    a holding member by which a substrate is held, the holding member being movable below the projection system and the opening,
    wherein the substrate held by the holding member is exposed through the liquid that is supplied from the opening and that covers only a portion of an upper surface of the substrate.

2. The apparatus of claim 1, further comprising a switching device configured to switch between a first state and a second state, the switching device attached adjacent to the second end of the flow passage, the opening being connected to the liquid source via the flow passage in the first state and the opening being connected to the vacuum source via the flow passage in the second state.

3. The apparatus of claim 1, further comprising a switching device which switches between a first state and a second state, the switching device attached adjacent to the second end of the flow passage, the flow passage being provided between the switching device and the opening, the opening being connected to the liquid source via the flow passage in the first state, and the opening being connected to the vacuum source via the flow passage in the second state.

4. The apparatus of claim 1, wherein a plurality of openings including the opening are provided around the space under the projection system, the plurality of openings surrounding the space.

5. The apparatus of claim 4, wherein the plurality of openings face downwardly.

6. The apparatus of claim 4, wherein the plurality of openings are arranged such that the upper surface of the substrate faces the plurality of openings.

7. The apparatus of claim 4, wherein the plurality of openings are arranged substantially in a shape of a quadrangle.

8. The apparatus of claim 7, wherein the plurality of openings are arranged in a substantially rectangular shape.

9. The apparatus of claim 4, wherein the plurality of openings are arranged in a shape having four sides.

10. The apparatus of claim 9, wherein the four sides are straight.

11. The apparatus of claim 1, wherein the opening and a bottom surface of the projection system are located at a substantially same height.

12. A liquid immersion lithography method comprising:
    holding a substrate on a holding member that is movable below a projection system and an opening of a flow passage, the flow passage having a first end and a second end, the first end of the flow passage having the opening from which liquid is supplied to a space under the projection system, the opening being connectable to a liquid source via the second end of the flow passage to supply the liquid to the space, the opening being connectable to a vacuum source via the second end of the flow passage; and
    exposing the substrate held by the holding member through the liquid that is supplied from the opening and that covers only a portion of an upper surface of the substrate.

13. The method of claim 12, further comprising switching a switching device, attached adjacent to the second end of the flow passage, between a first state and a second state, the opening being connected to the liquid source via the flow passage in the first state and the opening being connected to the vacuum source via the flow passage in the second state.

14. The method of claim 12, further comprising switching a switching device, attached adjacent to the second end of the flow passage, between a first state and a second state, the flow passage being provided between the switching device and the opening, the opening being connected to the liquid source via the flow passage in the first state, and the opening being connected to the vacuum source via the flow passage in the second state.

15. The method of claim 12, wherein a plurality of openings including the opening are provided around the space under the projection system, the plurality of openings surrounding the space.

16. The method of claim 15, wherein the plurality of openings face downwardly.

17. The method of claim 15, wherein the plurality of openings are arranged such that the upper surface of the substrate faces the plurality of openings.

18. The method of claim 15, wherein the plurality of openings are arranged substantially in a shape of a quadrangle.

19. The method of claim 18, wherein the plurality of openings are arranged in a substantially rectangular shape.

20. The method of claim 15, wherein the plurality of openings are arranged in a shape having four sides.

21. The method of claim 20, wherein the four sides are straight.

22. The method of claim 12, wherein the opening and a bottom surface of the projection system are located at a substantially same height.

* * * * *